(12) United States Patent
Choi

(10) Patent No.: US 7,035,164 B2
(45) Date of Patent: Apr. 25, 2006

(54) SEMICONDUCTOR MEMORY DEVICE WITH A BYPASS CIRCUIT FOR VERIFYING THE CHARACTERISTICS OF AN INTERNAL CLOCK SIGNAL

(75) Inventor: Jung-Hwan Choi, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 108 days.

(21) Appl. No.: 10/861,038

(22) Filed: Jun. 4, 2004

(65) Prior Publication Data
US 2005/0002261 A1    Jan. 6, 2005

(30) Foreign Application Priority Data
Jun. 4, 2003    (KR) ...................... 10-2003-0035907

(51) Int. Cl.
*G11C 8/00*    (2006.01)
(52) U.S. Cl. ............. 365/233; 365/189.02; 365/189.03
(58) Field of Classification Search ...................... None
See application file for complete search history.

(56) References Cited

U.S. PATENT DOCUMENTS

| | | | |
|---|---|---|---|
| 5,146,427 A * | 9/1992 | Sasaki et al. | 365/189.05 |
| 5,523,981 A * | 6/1996 | Yamaguchi et al. | 365/233 |
| 6,456,561 B1 * | 9/2002 | Maeda | 365/233 |
| 6,545,937 B1 * | 4/2003 | Pawlowski | 365/230.06 |

* cited by examiner

*Primary Examiner*—Son Mai
(74) *Attorney, Agent, or Firm*—F.Chau & Associates, LLC (57) ABSTRACT

A semiconductor memory device comprising a bypass circuit for verifying the characteristics of an internal clock signal is provided. The semiconductor memory device having a bypass circuit for verifying the characteristics of an internal clock signal comprises an output circuit, an input circuit, a first bypass circuit and a second bypass circuit. The output circuit outputs data received from an internal circuit, to an input/output (I/O) interface in synchronism with an output clock signal. The input circuit outputs data received from the I/O interface, to the internal circuit in synchronism with an input clock signal. The first bypass circuit transmits the output clock signal to the I/O interface in response to one of a plurality of control signals. The second bypass circuit transmits the input clock signal to the I/O interface in response to one of the plurality of control signals. When one of the first and second bypass circuits is operating, the output circuit and the input circuit stop operating.

27 Claims, 7 Drawing Sheets

SEMICONDUCTOR MEMORY DEVICE WITH A BYPASS CIRCUIT FOR VERIFYING THE CHARACTERISTICS OF AN INTERNAL CLOCK SIGNAL

CROSS-REFERENCE TO RELATED APPLICATION

This application claims priority to Korean Patent Application No. 2003-35907, filed Jun. 4, 2003, the disclosure of which is incorporated herein by reference.

BACKGROUND OF THE INVENTION

1. Technical Field

The present invention relates to a semiconductor memory device, and more particularly, to a semiconductor memory device having a bypass circuit for verifying the characteristics of an internal clock signal.

2. Discussion of the Related Art

Generally, in an input/output (I/O) interface method in which data is transmitted after being synchronized with a clock frequency, for example, when data is transmitted between a semiconductor memory device and a memory controller, it is important to achieve accurate synchronization between a clock signal and the data being transmitted as load on a bus between the semiconductor memory device and the memory controller and the data's transmission frequency increase.

In order to place data at the edge or center of a clock signal, a clock signal having portions allocated for data transmission is reverse compensated for the time taken to load the data on the bus. Accordingly, an internal clock generation circuit, which receives an external clock signal and generates an internal clock signal for each element in the circuit, is used in a semiconductor memory device. An example of a semiconductor memory device using an internal clock signal generation circuit is disclosed in U.S. Pat. No. 6,509,763 entitled, "Semiconductor Device Using Complementary Clock and Signal Input State Detection Circuit Used for the Same".

Figure 1:
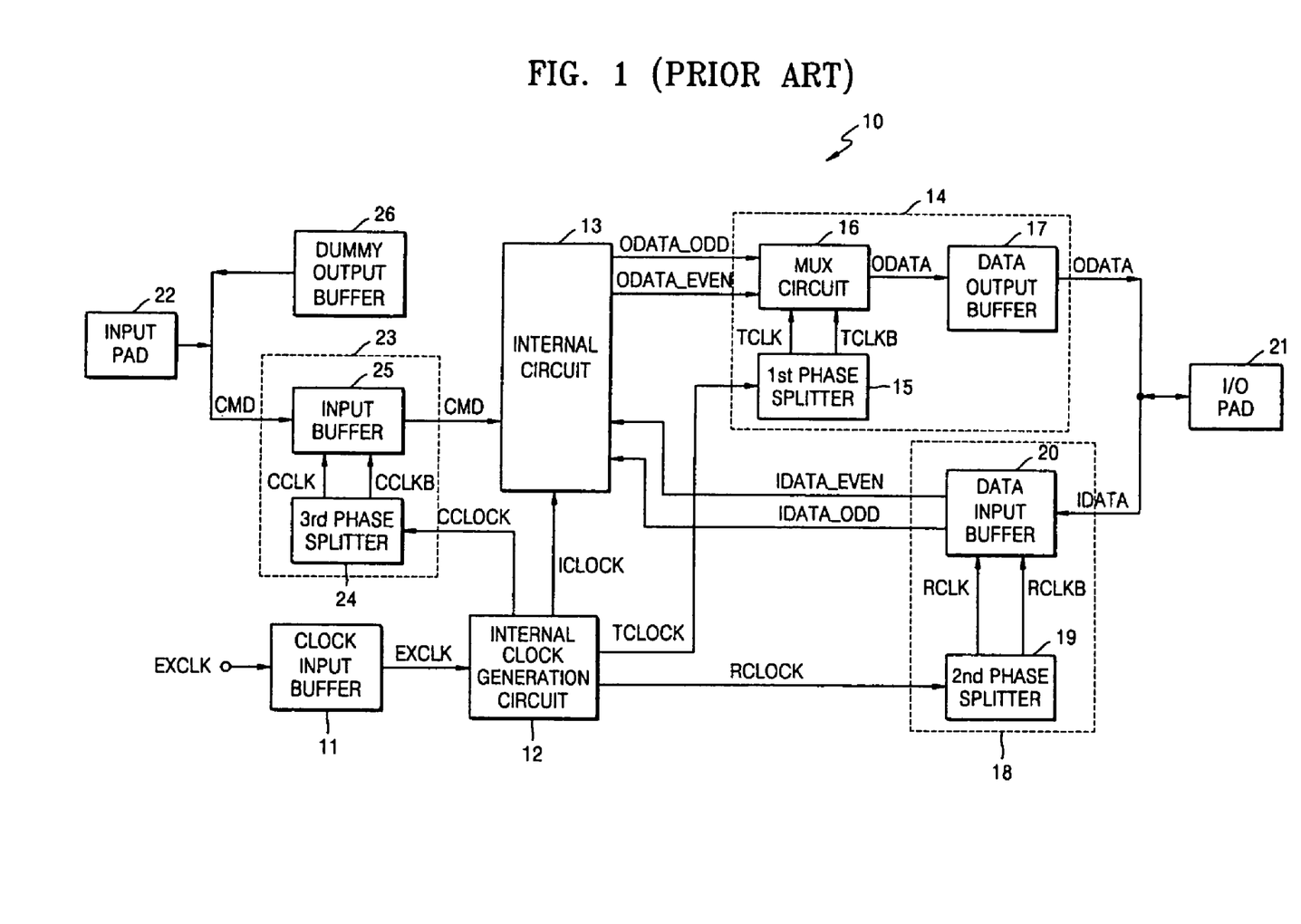
FIG. 1 is a block diagram of a semiconductor memory device according to the prior art.

FIG. 1 is a block diagram of a semiconductor memory device 10 according to the prior art. Referring to FIG. 1, the semiconductor memory device 10 comprises a clock input buffer 11, an internal clock generation circuit 12, an internal circuit 13, a data output circuit 14, a data input circuit 18, and a command input circuit 23. The clock input buffer 11 receives and outputs an external clock signal (EXCLK). The internal clock generation circuit 12 receives the external clock signal (EXCLK) output from the clock input buffer 11, and generates a plurality of internal clock signals (ICLOCK, TCLOCK, RCLOCK, CCLOCK). The internal circuit 13 comprises a dynamic random access memory (DRAM) core circuit (not shown) and peripheral circuits (not shown), and receives the internal clocks signal (ICLOCK) output from the internal clock generation circuit 12.

The data output circuit 14 receives output data signals (ODATA_ODD, ODATA_EVEN) output from the internal circuit 13, which become synchronized with the internal clock signal (TCLOCK), and outputs an output data signal (ODATA) to the outside (e.g., an external device) through an I/O pad 21. The data output circuit 14 comprises a first phase splitter 15, a multiplexer (MUX) circuit 16, and a data output buffer 17. The first phase splitter 15 receives the internal clock signal (TCLOCK), and outputs complementary output clock signals (TCLK, TCLKB). The MUX circuit 16, which is synchronized with the complementary output clock signals (TLCK, TCLKB), outputs the output data signals (ODATA_ODD, ODATA_EVEN) alternately. In other words, the MUX circuit 16 generates an output data signal (ODATA) in which the output data signals (ODATA_ODD, ODATA_EVEN) are alternately arranged. The data output buffer 17 outputs the output data signal (ODATA) to the I/O pad 21.

The data input circuit 18 comprises a second phase splitter 19 and a data input buffer 20. The second phase splitter 19 receives the internal clock signal (RCLOCK) output from the internal clock generation circuit 12, and outputs complementary input clock signals (RCLK, RCLKB). The data input buffer 20 receives the input data signal (IDATA) through the I/O pad 21. The data input buffer 20 synchronizes the received input data signal (IDATA) with the complementary input clock signals (RCLK, RCLKB) and outputs input data signals (IDATA_EVEN, IDATA_ODD) that are transmitted to the internal circuit 13.

The command input circuit 23 comprises a third phase splitter 24 and an input buffer 25. The third phase splitter 24 receives the internal clock signal (CCLOCK) output from the internal clock generation circuit 12 and outputs complementary command clock signals (CCLK, CCLKB). The input buffer 25 receives a command signal (CMD) through an input pad 22 and is synchronized with the complementary command clock signals (CCLK, CCLKB) and outputs the command signal (CMD) to the internal circuit 13. A dummy output buffer 26 has the same or similar capacitance as the input buffer 25, and functions as a dummy circuit.

The data input/output circuits 14 and 18 and the command input circuit 23, which receives a command signal, perform I/O operations that are synchronized with the internal clock signals (TCLOCK, RCLOCK, CCLOCK). In order, however, to accurately synchronize I/O data, the characteristics of the internal clock signals (TCLOCK, RCLOCK, CCLOCK) are verified as changes in the characteristics (e.g., waveforms, jitter components, duties, etc.) of the internal clock signals influence the I/O data. The characteristics, however, of the internal clock signals can not be verified when the semiconductor memory device of FIG. 1 is in a packaged state.

Accordingly, there is need for a method by which the characteristics of the internal clock signals of a semiconductor memory device can be verified when the semiconductor memory device is in a packaged state.

SUMMARY OF THE INVENTION

The present invention provides a semiconductor memory device comprising a bypass circuit that enables the characteristics of an internal clock signal to be verified when the semiconductor memory device is in a packaged state.

According to an aspect of the present invention, a semiconductor memory device, comprises: an output circuit, which outputs data received from an internal circuit, to an input/output (I/O) interface in synchronism with an output clock signal; an input circuit, which outputs data received from the I/O interface, to the internal circuit in synchronism with an input clock signal; a first bypass circuit which transmits the output clock signal to the I/O interface; and a second bypass circuit which transmits the input clock signal to the I/O interface, wherein, when one of the first and second bypass circuits is operating, the output circuit and the input circuit stop operating.

The output circuit comprises: a first phase splitter which receives the output clock signal and outputs a complementary output clock signal; and a multiplexer (MUX) which outputs the data received from the internal circuit in synchronism with the complementary output clock signal, and in response to one of a plurality of control signals stops operating. The output circuit further comprises: a data output buffer which outputs the data received from the output circuit to the I/O interface, wherein the data output buffer outputs one of the output clock signal received from the first bypass circuit and the input clock signal received from the second bypass circuit, to the output interface when the output circuit and the input circuit stop operating.

The semiconductor memory device further comprises: a data output buffer which outputs the data received from the output circuit to the I/O interface, wherein the data output buffer outputs one of the output clock signal received from the first bypass circuit and the input clock signal received from the second bypass circuit, to the output interface when the output circuit and the input circuit stop operating. The input circuit comprises: a second phase splitter which receives the input clock signal and outputs a complementary input clock signal; and an input buffer which receives input data from the I/O interface, outputs the input data to the internal circuit in synchronism with the complementary input clock signal, and in response to one of a plurality of control signals stops operating.

The first bypass circuit comprises: a first output clock bypass circuit and a second output clock bypass circuit, wherein the first output clock bypass circuit comprises a first inverter and a first transmission gate; and the second output clock bypass circuit comprises a second inverter and a second transmission gate. The first output clock bypass circuit transmits the output clock signal to the I/O interface in response to one of the plurality of control signals; and the second output clock bypass circuit transmits the complementary output clock signal to the I/O interface in response to one of the plurality of control signals.

The second bypass circuit comprises: a first input clock bypass circuit and a second input clock bypass circuit, wherein the first input clock bypass circuit comprises a first inverter and a first transmission gate; and the second input clock bypass circuit comprises a second inverter and a second transmission gate. The first input clock bypass circuit transmits the input clock signal to the I/O interface in response to one of the plurality of control signals; and the second input clock bypass circuit transmits the complementary input clock signal to the I/O interface in response to one of the plurality of control signals.

The semiconductor memory device further comprises: a clock output buffer for outputting one of the output clock signal received from the first bypass circuit and the input clock signal received from the second bypass circuit to the I/O interface. The semiconductor memory device also comprises: a control circuit which generates a plurality of control signals in response to an address signal and an external control signal. The control circuit comprises: a decoder which combines the address signal and the external control signal and generates a set code; and a register which generates the plurality of control signals in response to the set code. The first and second bypass circuits are directly connected to the I/O interface.

According to another aspect of the present invention, a semiconductor memory device, comprises: an input circuit which outputs an input signal received from an input interface, to an internal circuit in synchronism with an internal clock signal; and a bypass circuit which transmits the internal clock signal to the input interface, wherein, when the bypass circuit operates, the input circuit stops operating.

The input circuit comprises: a phase splitter which receives the internal clock signal and outputs a complementary internal clock signal; and an input buffer which receives the input signal through the input interface, outputs the input signal to the internal circuit in synchronism with the complementary internal clock signal, and in response to one of a plurality of enable signals stops operating. The bypass circuit comprises: a first bypass circuit which transmits the internal clock signal to the input interface in response to one of the plurality of enable signals; and a second bypass circuit which transmits the complementary internal clock signal to the input interface in response to one of the plurality of enable signals.

The semiconductor memory device further comprises: a dummy output buffer, connected between the bypass circuit and the input interface, wherein the dummy output buffer outputs the internal clock signal to the input interface when the input circuit stops operating. The semiconductor memory device also comprises: a clock output buffer, connected to the input interface and the bypass circuit, wherein the clock output buffer outputs the internal clock signal to the input interface when the input circuit stops operating. The bypass circuit is directly connected to the input interface.

The semiconductor memory device further comprises: a clock input buffer which receives an external clock signal and transmits the external clock signal; an internal clock generation circuit which receives the external clock signal and generates the internal clock signal; and a control circuit which receives an address and a control signal and generates a plurality of enable signals.

According to yet another aspect of the present invention, a semiconductor memory device, comprises: an output circuit which outputs data received from an internal circuit to an output interface, in synchronism with an output clock signal; a bypass circuit which transmits the output clock signal to the output interface, wherein, when the bypass circuit is operating, the output circuit stops operating.

The output circuit comprises: a phase splitter which receives the output clock signal and outputs a complementary output clock signal; and a multiplexer (MUX) which outputs the data received from the internal circuit, in synchronism with the complementary output clock signal, and in response to one of a plurality of enable signals stops operating.

The bypass circuit comprises: a first bypass circuit which transmits the output clock signal to the output interface in response to one of a plurality of enable signals; and a second bypass circuit which transmits the complementary output clock signal to the output interface in response to one of the plurality of enable signals.

The semiconductor memory further comprises: a clock output buffer, connected to the output interface and the bypass circuit, wherein the clock output buffer outputs the output clock signal to the output interface when the output circuit stops operating; and a data output buffer which outputs the data received from the output circuit to the output interface, wherein the data output buffer outputs the output clock signal received from the bypass circuit to the output interface when the output circuit stops operating. The bypass circuit is directly connected to the output interface.

The semiconductor memory device further comprises: a clock input buffer which receives an external clock signal and transmits the external clock signal; an internal clock generation circuit which receives the external clock signal and generates the output clock signal; and a control circuit which receives an address and a control signal and generates a plurality of enable signals.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

Figure 2:
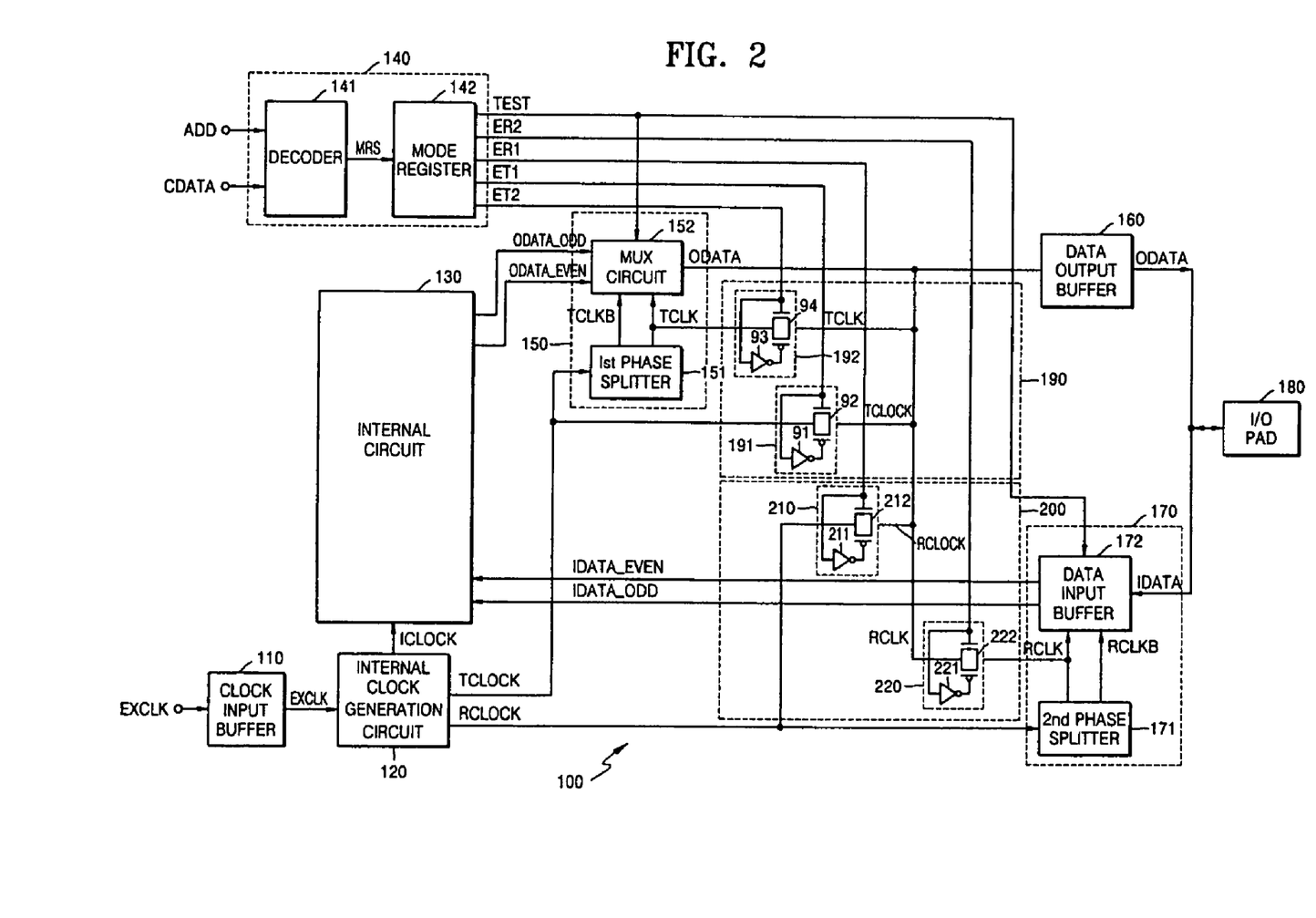
FIG. 2 is a block diagram of a semiconductor memory device having a bypass circuit for verifying the characteristics of an internal clock signal according to an exemplary embodiment of the present invention.

Referring to FIG. 2, a semiconductor memory device 100 having first and second bypass circuits 190, 200 according to an exemplary embodiment of the present invention comprises a clock input buffer 110, an internal clock generation circuit 120, an internal circuit 130, and a control circuit 140. The semiconductor memory device 100 further comprises a data output circuit 150, a data output buffer 160, a data input circuit 170, the first bypass circuit 190, and the second bypass circuit 200.

The clock input buffer 110 receives an external clock signal (EXCLK) and outputs the received external clock signal (EXCLK) to the internal clock generation circuit 120. The internal clock generation circuit 120 receives the external clock signal (EXCLK) and outputs a clock signal (ICLOCK), an output clock signal (TCLOCK), and an input clock signal (RCLOCK). The internal circuit 130 comprises a dynamic random access memory (DRAM) core circuit (not shown) and peripheral circuits (not shown) and receives the clock signal (ICLOCK) output from the internal clock generation circuit 120.

The control circuit 140 receives an address signal (ADD) and a control data signal (CDATA) from, for example, an external device and generates a plurality of control signals (TEST, ET1, ET2, ER1, ER2). The control circuit 140 comprises a decoder 141 and a mode register 142. The decoder 141 receives the address signal (ADD) and the control data signal (CDATA), decodes the signals, and generates a mode register set (MRS) code. The mode register 142 is programmed according to the MRS code and outputs a plurality of control signals (TEST, ET1, ET2, ER1, ER2).

In FIG. 2, the control circuit 140 is shown with the decoder 141 and the mode register 142, and when only several of the control signals (TEST, ET1, ET2, ER1, ER2) are generated, the control circuit 140 can be configured to transmit the control signals in a variety of ways. For example, although FIG. 2 illustrates the control circuit 140 generating the control signal (TEST), the control circuit 140 may also generate only the control signals (ET1, ET2, ER1, ER2) with the control signal (TEST) being replaced by an enable signal.

The data output circuit 150 receives output data signals (ODATA_ODD, ODATA_EVEN) output from the internal circuit 130, and outputs the output data signal (ODATA) in synchronism with the output clock signal (TCLOCK). The data output circuit 150 comprises a first phase splitter 151 and a multiplexer (MUX) circuit 152. The first phase splitter 151 receives the output clock signal (TCLOCK) output from the internal clock generation circuit 120 and outputs complementary output clock signals (TCLK, TCLKB). The MUX circuit 152 alternately outputs the output data signals (ODATA_ODD, ODATA_EVEN) in synchronism with the complementary output clock signals (TCLK, TCLKB). As a result, the MUX circuit 152 outputs the output data signal (ODATA) in which the output data signals (ODATA_ODD, ODATA_EVEN) are alternately arranged. In addition, the MUX circuit 152 stops the output operation of the output data signal (ODATA) in response to the control signal (TEST). The data output buffer 160 receives the output data signal (ODATA) output from the MUX circuit 152 and outputs the output data signal (ODATA) to an input/output (I/O) pad 180.

The data input circuit 170 comprises a second phase splitter 171 and a data input buffer 172. The second phase splitter 171 receives the input clock signal (RCLOCK) output from the internal clock generation circuit 120 and outputs the complementary input clock signals (RCLK, RCLKB). The data input buffer 172 receives an input data signal (IDATA) through the I/O pad 180. The data input buffer 172 outputs the received input data signal (IDATA) as input data signals (IDATA_EVEN, IDATA_ODD) in synchronism with the complementary input clock signals (RCLK, RCLKB). In addition, the data input buffer 172 stops the output operation of the input data signals (IDATA_EVEN, IDATA_ODD) in response to the control signal (TEST). The input data signals (IDATA_EVEN, IDATA_ODD) are transmitted to the internal circuit 130.

The first bypass circuit 190 transfers the output clock signal (TCLOCK) or the complementary output clock signal (TCLK) through a bypass to the data output buffer 160 in response to the control signals (ET1, ET2). The first bypass circuit 190 comprises a first output clock bypass circuit 191 and a second output clock bypass circuit 192. The first output clock bypass circuit 191 comprises an inverter 91 and a transmission gate 92 and the second output clock bypass circuit 192 also comprises an inverter 93 and a transmission gate 94. The inverter 91 inverts the control signal (ET1) and outputs the inverted signal to a gate of a positive channel metal oxide semiconductor (PMOS) transistor of the transmission gate 92. The control signal (ET1) is input to a gate of a negative channel metal oxide semiconductor (NMOS) transistor of the transmission gate 92. The inverter 93 inverts the control signal (ET2) and outputs the inverted signal to a gate of a PMOS transistor of the transmission gate 94. The control signal (ET2) is input to a gate of an NMOS transistor of the transmission gate 94. The output terminals of the transmission gates 92 and 94 are connected to the data output buffer 160.

The transmission gates 92 and 94 are turned on or off by the control signals (ET1, ET2), respectively. More specifically, when the control signal (ET1) is enabled, the transmission gate 92 is turned on and the output clock signal (TCLOCK) is output to the data output buffer 160. Further, when the control signal (ET2) is enabled, the transmission gate 94 is turned on and the complementary output clock signal (TCLK) is output to the data output buffer 160. In addition, the second bypass circuit 200 transfers the input clock signal (RCLOCK) or the complementary output clock signal (RCLK) through a bypass to the data output buffer 160 in response to the control signals (ER1, ER2).

The second bypass circuit 200 comprises a first input clock bypass circuit 210 and a second input clock bypass circuit 220. The first input clock bypass circuit 210 comprises an inverter 211 and a transmission gate 212 and the second input clock bypass circuit 220 also comprises an inverter 221 and a transmission gate 222. The inverter 211 inverts the control signal (ER1) and outputs the inverted signal to a gate of a PMOS transistor of the transmission gate 212. The control signal (ER1) is input to a gate of an NMOS transistor of the transmission gate 212. The inverter 221 inverts the control signal (ER2) and outputs the inverted signal to the gate of a PMOS transistor of the transmission gate 222. The control signal (ER2) is input to a gate of an NMOS transistor of the transmission gate 222. The output terminals of the transmission gates 212 and 222 are connected to the data output buffer 160.

The transmission gates 212 and 222 are turned on or off by the control signals (ER1, ER2), respectively. More specifically, when the control signal (ER1) is enabled, the transmission gate 212 is turned on and the input clock signal (RCLOCK) is output to the data output buffer 160. Further, when the control signal (ER2) is enabled, the transmission gate 222 is turned on and the complementary input clock signal (RCLK) is output to the data output buffer 160.

As shown in FIG. 2, when one of the first and second output clock bypass circuits 191 and 192 or one of the first and second input clock bypass circuits 210 and 220 operates, the control signal (TEST) is enabled. In response to the control signal (TEST), the MUX circuit 152 and the data input buffer 172 stop operating.

The operation of the semiconductor memory device 100 will now be explained referring to FIG. 2. If the address signal (ADD) and the control data signal (CDATA) for verifying a predetermined internal clock signal are received, the decoder 141 of the control circuit 140 decodes the received signals and generates the MRS code (MRS). The mode register 142 of the control circuit 140 is programmed according to the MRS code (MRS) and enables the control signal (TEST) and one of the control signals (ET1, ET2, ER1, ER2). For convenience, an example in which the mode register 142 enables the control signals (TEST, ET1) will now be explained.

When the control signal (TEST) is enabled, the MUX circuit 152 and the data input buffer 172 stop operating. In addition, when the control signal (ET1) is enabled, the transmission gate 92 of the first output clock bypass circuit 191 is turned on. As a result, the first output clock bypass circuit 191 transfers the output clock signal (TCLOCK) output from the internal clock generation circuit 120 through a bypass to the data output buffer 160. The data output buffer 160 outputs the output clock signal (TCLOCK) to the outside of the semiconductor chip through the I/O pad 180 or internal or external I/O pins (not shown). Accordingly, a user can verify the characteristics of the output clock signal (TCLOCK) output to the I/O pad 180 or the internal or external pins by using, for example, an oscilloscope.

Similar to the first output clock bypass circuit 191, the operations of the second output clock bypass circuit 192, the first input clock bypass circuit 210, and the second input clock bypass circuit 220 are controlled by control signals (ET2, ER1, ER2). Thus, if one of the control signals (ET1, ET2, ER1, ER2) is enabled, one of the clock signals (TCLOCK, TCLK, RCLOCK, RCLK) is output through the data output buffer 160 to the I/O pad 180. In this example, according to the address signal (ADD) and the control data signal (CDATA) input to the control circuit 140, one of the control signals (e.g., ET1) is enabled.

Figure 3:
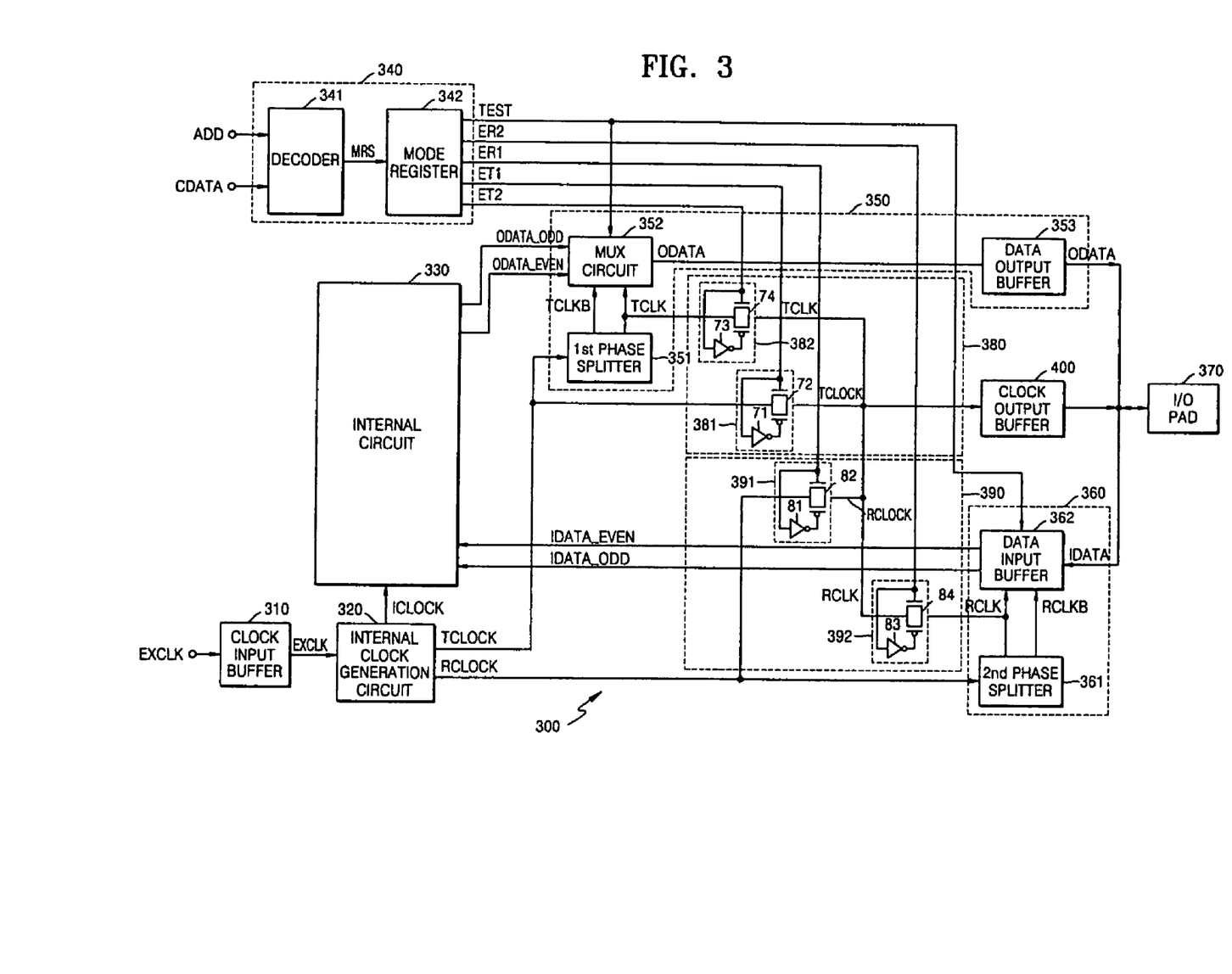
FIG. 3 is a block diagram of a semiconductor memory device having a bypass circuit for verifying the characteristics of an internal clock signal according to another exemplary embodiment of the present invention.

FIG. 3 is a block diagram of a semiconductor memory device 300 having first and second bypass circuits 380, 390 for verifying the characteristics of an internal clock signal according to another exemplary embodiment of the present invention. Referring to FIG. 3, the semiconductor memory device 300 comprises a clock input buffer 310, an internal clock generation circuit 320, an internal circuit 330, and a control circuit 340. The semiconductor memory device 300 further comprises a data output circuit 350, a data input circuit 360, the first bypass circuit 380, the second bypass circuit 390, and a clock output buffer 400.

The structure of the semiconductor memory device 300 is the same or similar to that of the semiconductor memory device 200 of FIG. 2. Accordingly, and in an effort to avoid repetition, the components of the semiconductor device 300 that are the same or similar to the components in the semiconductor memory device 200 will not be described in detail.

As shown in FIG. 3, the data output circuit 350 includes a first phase splitter 351, a MUX circuit 352, and a data output buffer 353. The semiconductor memory device 300 also includes a clock output buffer 400. Output terminals of first and second output clock bypass circuits 381 and 382 of the first bypass circuit 380 are connected to an input terminal of the clock output buffer 400. In addition, output terminals of the first and second input clock bypass circuits 391 and 392 of the second bypass circuit 390 are connected to the input terminal of the clock output buffer 400.

When the MUX circuit 352 operates, the data output buffer 353 outputs an output data signal (ODATA) through an I/O pad 370 to internal or external I/O pins (not shown). The clock output buffer 400 additionally outputs the clock signal output from the first output clock bypass circuit 381, the second output clock bypass circuit 382, the first input clock bypass circuit 391, or the second input clock bypass circuit 392, through the I/O pad 370 to the internal or external I/O pins (not shown).

Here, the clock output buffer 400 is implemented using a complementary metal oxide semiconductor (CMOS) inverter, which maintains a predetermined voltage level of the internal clock signal output to the I/O pad 370. Accordingly, if the clock signals (TCLOCK, TCLK, RCLOCK, RCLK) are output through the clock output buffer 400 from the semiconductor memory device 300, a change in the voltage level of the clock signals (TCLOCK, TCLK, RCLOCK, RCLK) is prevented. For example, because the clock signals (TCLOCK, TCLK, RCLOCK, RCLK) output from the bypass circuits 191, 192, 210, and 220 of FIG. 2 are output through the data output buffer 160 of the semiconductor memory device 200, a change in their voltage level occurs.

Figure 4:
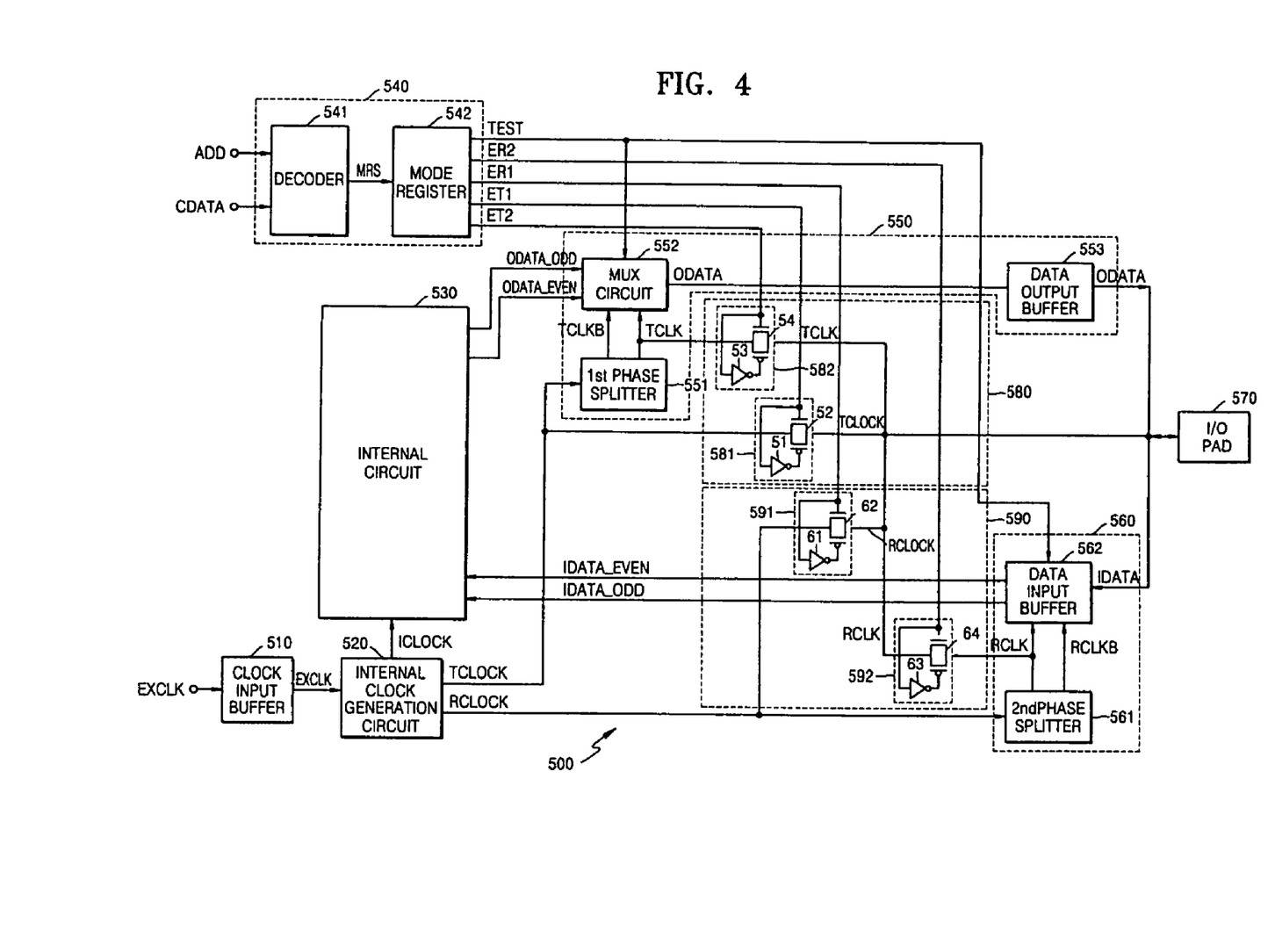
FIG. 4 is a block diagram of a semiconductor memory device having a bypass circuit for verifying the characteristics of an internal clock signal according to yet another exemplary embodiment of the present invention.

FIG. 4 is a block diagram of a semiconductor memory device 500 having first and second bypass circuits 580, 590 for verifying the characteristics of an internal clock signal according to yet another exemplary embodiment of the present invention. Referring to FIG. 4, the semiconductor memory device 500 comprises a clock input buffer 510, an internal clock generation circuit 520, an internal circuit 530, and a control circuit 540. The semiconductor memory device 500 further comprises a data output circuit 550, a data input circuit 560, the first bypass circuit 580, and the second bypass circuit 590.

The structure of the semiconductor memory device 500 is the same or similar to that of the semiconductor memory device 300 of FIG. 3. Accordingly, and in an effort to avoid repetition, the components of the semiconductor device 500 that are the same or similar to the components in the semiconductor memory device 300 will not be described in detail.

As shown in FIG. 4, output terminals of first and second output clock bypass circuits 581 and 582 of the first bypass circuit 580 and output terminals of first and second input clock bypass circuits 591 and 592 of the second bypass circuit 590 are connected to an I/O pad 570. Accordingly, a clock signal output from one of the bypass circuits 581, 582, 591, and 592 is output through the I/O pad 570 to internal or external I/O pins (not shown).

Because the clock signals (TCLOCK, TCLK, RCLOCK, RCLK) are output to the I/O pad 570 without passing through an output buffer in the semiconductor memory device 500, a noise component typically added by an output buffer, which is used to buffer the internal clock signals (TCLOCK, TCLK, RCLOCK, RCLK), is prevented. As a result, verification of the characteristics of the internal clock signals (TCLOCK, TCLK, RCLOCK, RCLK), which are similar to the actual internal clock signals (TCLOCK, TCLK, RCLOCK, RCLK) can take place.

As shown in FIG. 3, however, because the clock signals (TCLOCK, TCLK, RCLOCK, RCLK) output from the bypass circuits 381, 382, 391, and 392 are output through the clock output buffer 400 directly to the I/O pad noise may be added to the clock signals (TCLOCK, TCLK, RCLOCK, RCLK). It is to be understood, however, that the bypass circuits (191, 192, 210, 220, 381, 382, 391, and 392) of FIGS. 2 and 3 can be directly connected to an I/O pad similar to that as shown in FIG. 4, thereby reducing noise that may be added to the signals (TCLOCK, TCLK, RCLOCK, RCLK). Also, it is to be understood that the data input circuits (170, 360, 560) of FIGS. 2 through 4 can be directly connected to an input pad (not shown) and the data output circuits (150, 350, 550) of FIGS. 2 through 4 can be directly connected to an output pad (not shown). In this case, input pins are connected to the input pad while output pins are connected to the output pad.

It should also be understood that if a bypass circuit for verifying the characteristics of an internal clock signal is disposed in the data input and output circuits of a semiconductor memory device, the characteristics of an internal clock signal, which vary depending on the location of the data input and output circuits or power supply, are observed. Thus, according to the semiconductor memory device of the present invention, an internal clock signal can be transferred to internal or external I/O pins through a bypass circuit such that the characteristics of the internal clock signal can be easily verified when the semiconductor memory device is in a packaged state. In addition, according to the semiconductor memory device of the present invention, the characteristics of the internal clock signal can be verified by excluding the influence of a data output circuit or a data input circuit, which may add noise to the clock signals whose characteristics are to be verified and/or tested.

Figure 5:
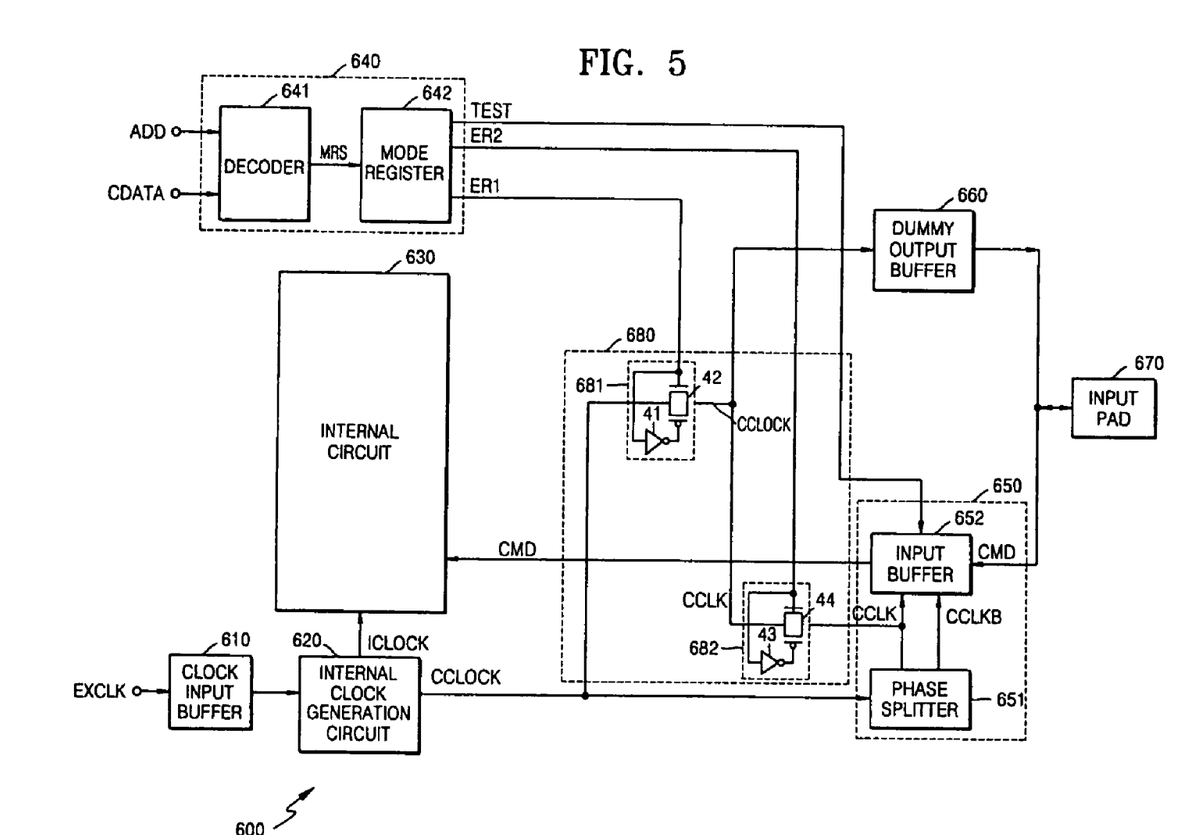
FIG. 5 is a block diagram of a semiconductor memory device having a bypass circuit for verifying the characteristics of an internal clock signal according to another exemplary embodiment of the present invention.

FIG. 5 is a block diagram of a semiconductor memory device 600 having a bypass circuit 680 for verifying the characteristics of an internal clock signal according to another exemplary embodiment of the present invention. Referring to FIG. 5, the semiconductor memory device 600 comprises a clock input buffer 610, an internal clock generation circuit 620, an internal circuit 630, a control circuit 640, a command input circuit 650, and the bypass circuit 680.

The clock input buffer 610 receives an external clock signal (EXCLK), and outputs the external clock signal (EXCLK) to the internal clock generation circuit 620. The internal clock generation circuit 620 receives the external clock signal (EXCLK) and outputs a clock signal (ICLOCK) and a command clock signal (CCLOCK). The internal circuit 630 comprises a DRAM core circuit (not shown) and peripheral circuits (not shown) and receives the clock signal (CLOCK) output from the internal clock generation circuit 620.

The control circuit 640 receives an address signal (ADD) and a control data signal (CDATA) from, for example, an interior or exterior device, and generates a plurality of control signals (TEST, ER1, ER2). The control circuit 640 comprises a decoder 641 and a mode register 642. The decoder 641 receives the address signal (ADD) and the control data signal (CDATA), decodes the signals, and generates an MRS code (MRS). The mode register 642 is programmed according to the MRS code and outputs the plurality of control signals (TEST, ER1, ER2).

In FIG. 5, the control circuit 640 is shown with the decoder 641 and the mode register 642, and if only several of the control signals (TEST, ER1, ER2) are generated, the control circuit 640 can be configured to transmit control signals in a variety of ways. For example, although FIG. 5 illustrates the control circuit 640 generating the control signal (TEST), the control circuit 640 may generate only the control signals (ER1, ER2) with the control signal (TEST) being replaced by an enable signal among the control signals (ER1, ER2).

The command input circuit 650 comprises a phase splitter 651 and an input buffer 652. The phase splitter 651 receives the command clock signal (CCLOCK) output from the internal clock generation circuit 620, and outputs complementary command clock signals (CCLK, CCLKB). The input buffer 652 receives a command signal (CMD) through an input pad 670. The input buffer 652 outputs the received command signal (CMD) to the internal circuit 630 in synchronism with the complementary command clock signals (CCLK, CCLKB). In addition, the input buffer 652 stops operating, in response to the control signal (TEST). In FIG. 5, a dummy output buffer 660 has the same or similar capacitance as the input buffer 652, and is a dummy circuit.

In response to the control signals (ER1, ER2), the bypass circuit 680 transfers the command clock signal (CCLOCK) or the complementary command clock signal (CCLK) through a bypass to the dummy output buffer 660. The bypass circuit 680 comprises a first command clock bypass circuit 681 and a second command clock bypass circuit 682. The first command clock bypass circuit 681 comprises an inverter 41 and a transmission gate 42 and the second command clock bypass circuit 682 also comprises an inverter 43 and a transmission gate 44. The inverter 41 inverts the control signal (ER1) and outputs the inverted signal to a gate of a PMOS transistor of the transmission gate 42. The control signal (ER1) is input to a gate of an NMOS transistor of the transmission gate 42. The inverter 43 inverts the control signal (ER2) and outputs the inverted signal to a gate of the PMOS transistor of the transmission gate 44. The control signal (ER2) is input to a gate of an NMOS transistor of the transmission gate 44. The output terminals of the transmission gates 42 and 44 are connected to the dummy output buffer 660.

The transmission gates 42 and 44 are turned on or off by the control signals (ER1, ER2), respectively. More specifically, when the control signal (ER1) is enabled, the transmission gate 42 is turned on and the command clock signal (CCLOCK) is output to the dummy output buffer 660. In addition, when the control signal (ER2) is enabled, the transmission gate 44 is turned on and the complementary command clock signal (CCLK) is output to the dummy output buffer 660. The dummy output buffer 660 outputs the command clock signal (CCLOCK) or the complementary command clock signal (CCLK) which is output from the first command clock bypass circuit 681 or the second command clock bypass circuit 682, to the input pad 670.

As shown in FIG. 5, when the first command clock bypass circuit 681 or the second command clock bypass circuit 682 operates, the control signal (TEST) is enabled. In response to the control signal (TEST), the input buffer 652 stops operating.

The operation of the semiconductor memory device 600 will now be explained referring to FIG. 5. When an address signal (ADD) and a control data signal (CDATA) for verifying a predetermined internal clock signal are received, the decoder 641 of the control circuit 640 decodes the received signals and generates an MRS code (MRS). The mode register 642 of the control circuit 640 is programmed according to the MRS code (MRS) and enables one of the control signals (ER1, ER2) and the control signal (TEST).

In this exemplary description it is to be assumed that the mode register 642 enables the control signals (TEST, ER1). Thus, for example, if the control signal (TEST) is enabled, the input buffer 652 stop operating, and if the control signal (ER1) is enabled, the transmission gate 42 of the first command clock bypass circuit 681 is turned on. As a result, the first command clock bypass circuit 681 transfers the command clock signal (CCLOCK) output from the internal clock generation circuit 620 through a bypass to the dummy output buffer 660. The dummy output buffer 660 outputs the command clock signal (CCLOCK) to the outside of the semiconductor chip through the input pad 670 or internal or external input pins (not shown). Thus, enabling a user to verify the characteristics of the command clock signal (CCLOCK) output to the input pad 670 or the internal or external input pins by using, for example, an oscilloscope.

Similar to the first command clock bypass circuit 681, the operation of the second command clock bypass circuit 682 is controlled by the control signal (ER2). For example, if one of the control signals (ER1, ER2) is enabled, one of the clock signals (CCLOCK, CCLK) is output through the dummy output buffer 660 to the input pad 670. In addition, one of the control signals (ER1, ER2) is enabled according to the address signal (ADD) and the control data signal (CDATA) input to the control circuit 640.

Figure 6:
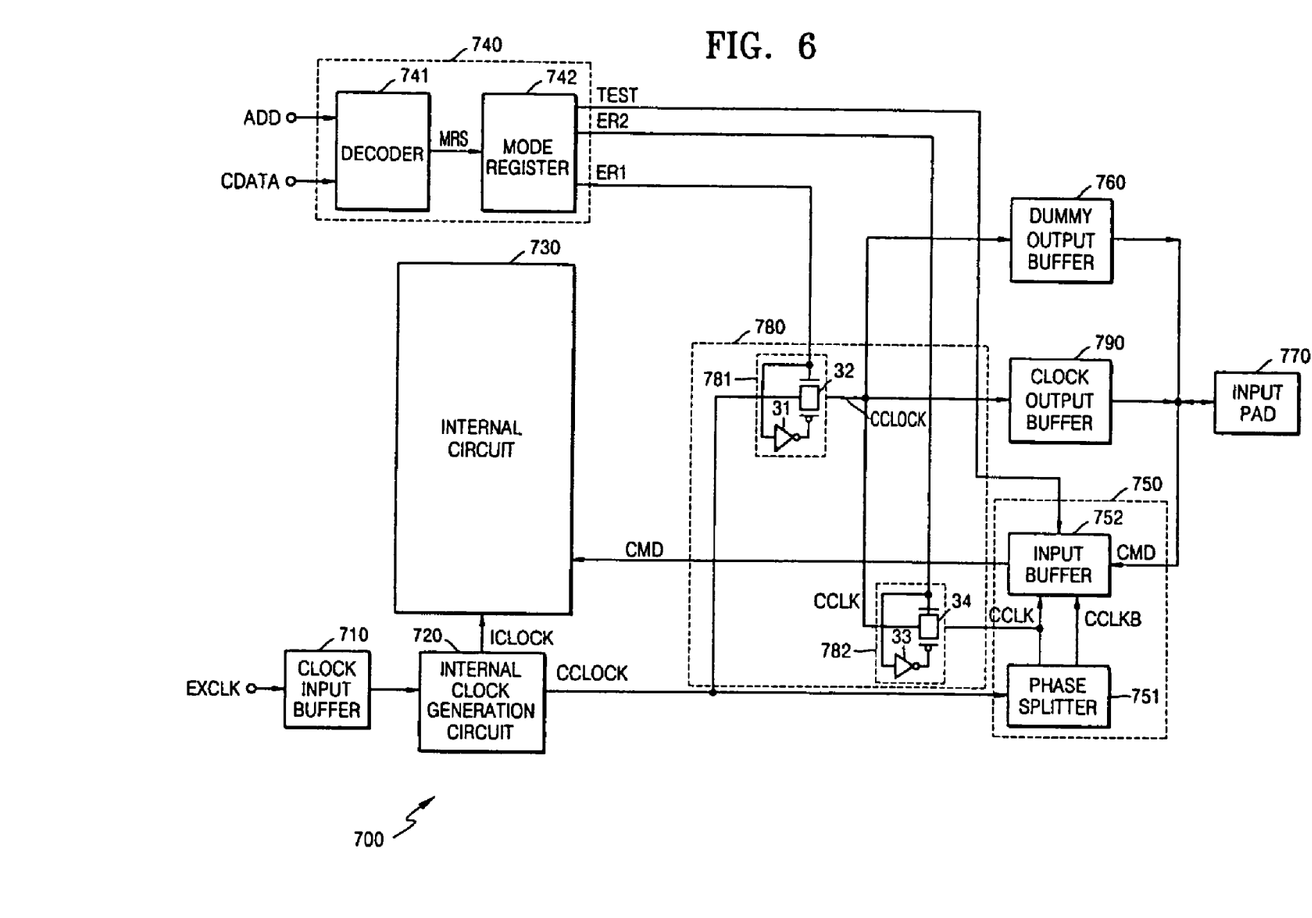
FIG. 6 is a block diagram of a semiconductor memory device having a bypass circuit for verifying the characteristics of an internal clock signal according to yet another exemplary embodiment of the present invention.

FIG. 6 is a block diagram of a semiconductor memory device 700 having a bypass circuit 780 for verifying the characteristics of an internal clock signal according to yet another exemplary embodiment of the present invention. Referring to FIG. 6, the semiconductor memory device 700 comprises a clock input buffer 710, an internal clock generation circuit 720, an internal circuit 730, a control circuit 740, a command input circuit 750, the bypass circuit 780, and a clock output buffer 790.

The structure of the semiconductor memory device 700 is the same or similar to that of the semiconductor memory device 600 of FIG. 5. Accordingly, and in an effort to avoid repetition, the components of the semiconductor device 700 that are the same or similar to the components in the semiconductor memory device 600 will not be described in detail.

As shown in FIG. 6, output terminals of the first and second command clock bypass circuits 781 and 782 of the bypass circuit 780 are connected to an input terminal of the clock output buffer 790. The clock output buffer 790 outputs the command clock signal (CCLOCK) output form the first command clock bypass circuit 781 or the complementary command clock signal (CCLK) output from the second command clock bypass circuit 782, through an input pad 770 to internal or external input pins (not shown).

As further shown in FIG. 6, the clock output buffer 790 can be implemented by a CMOS inverter, and it can maintain a predetermined voltage level of the internal clock signal output to the input pad 770. Accordingly, if clock signals (CCLOCK, CCLK) are output through the clock output buffer 790 from the semiconductor memory device 700, a change in the voltage level of the clock signals (CCLOCK, CCLK) is prevented. In addition, because the clock signals (CCLOCK, CCLK) output from the bypass circuits 681 and 682 are output through the dummy output buffer 660 of the semiconductor memory device 600, the voltage level of the clock signals (CCLOCK, CCLK) changes.

Figure 7:
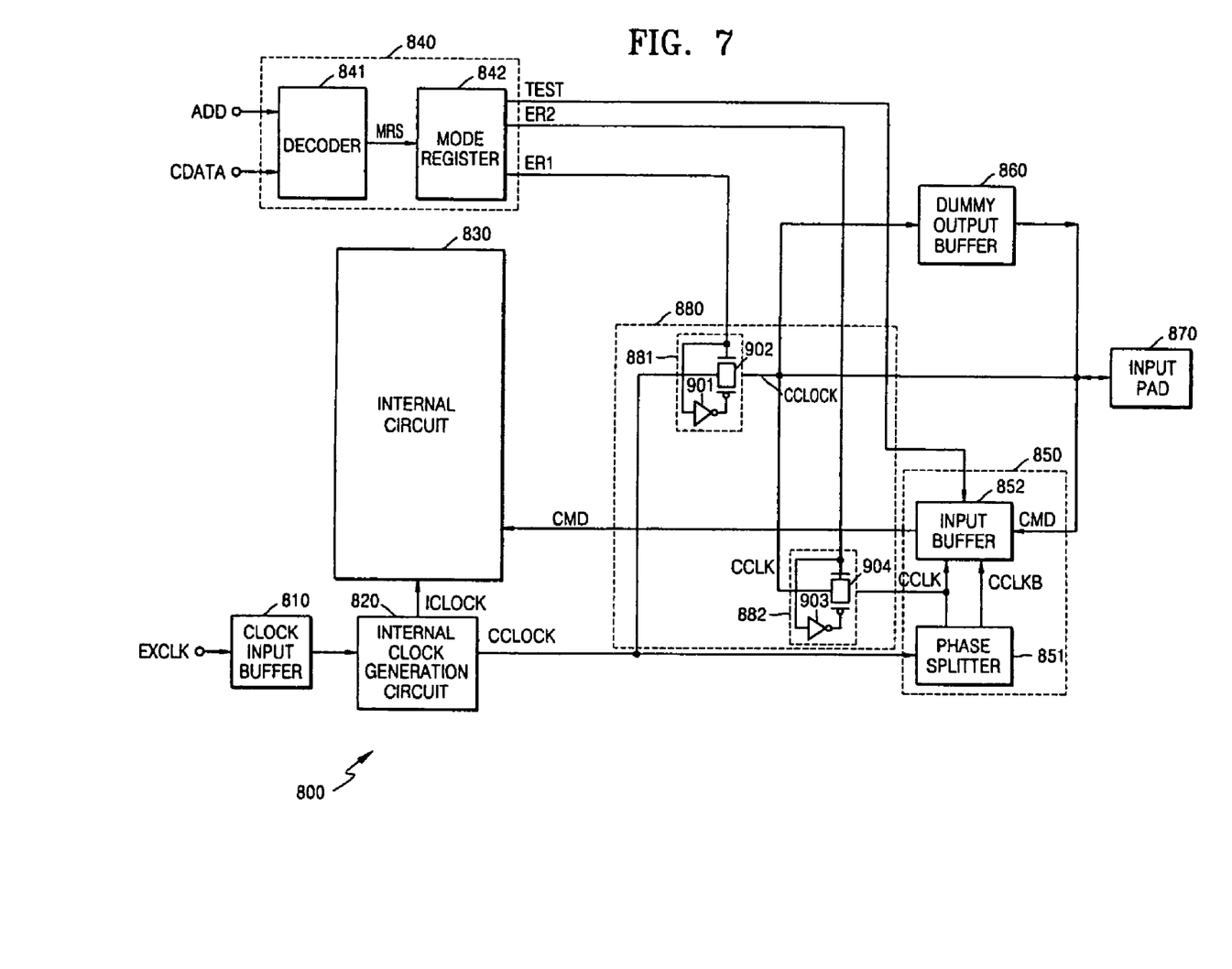
FIG. 7 is a block diagram of a semiconductor memory device having a bypass circuit for verifying the characteristics of an internal clock signal according to another exemplary embodiment of the present invention.

FIG. 7 is a block diagram of a semiconductor memory device 800 having a bypass circuit 880 for verifying the characteristics of an internal clock signal according to another exemplary embodiment of the present invention. Referring to FIG. 7, the semiconductor memory device 800 comprises a clock input buffer 810, an internal clock generation circuit 820, an internal circuit 830, a control circuit 840, a command input circuit 850, and the bypass circuit 880.

The structure of the semiconductor memory device 800 is the same or similar to that of the semiconductor memory device 700 of FIG. 6. Accordingly, an in an effort to avoid repetition, the components of the semiconductor device 800 that are the same or similar to the components in the semiconductor memory device 700 will not be described in detail.

As shown in FIG. 7, output terminals of first and second command clock bypass circuits 881 and 882 of the bypass circuit 880 are directly connected to an input pad 870. Accordingly, a command clock signal (CCLOCK) output from the first command clock bypass circuit 881 or a complementary command clock signal (CCLK) output from the second command clock bypass circuit 882 is output through the input pad 870 to internal or external input pins (not shown).

Because the clock signals (CCLOCK, CCLK) are output to the input pad 870 without passing through an output buffer in the semiconductor memory device 800, noise added by an output buffer to the clock signals (CCLOCK, CCLK) is prevented. As a result, verification of characteristics of the clock signals (CCLOCK, CCLK), which are similar to the actual clock signals (CCLOCK, CCLK) may take place.

As shown in FIG. 6, because the clock signals (CCLOCK, CCLK) output from the bypass circuits 781 and 782 are output through the clock output buffer 790, noise may be added to the clock signals (CCLOCK, CCLK). It is to be understood that the bypass circuits (682, 782, and 882) of FIGS. 5–7 can be connected to a circuit having only an input function such as an input circuit receiving an address signal.

It should also be understood that, in the semiconductor memory devices of FIGS. 5–7, an internal clock signal is transferred to internal or external input pins through a bypass circuit to enable the characteristics of the internal clock signal to be easily verified when the semiconductor memory devices are in a packaged state. In addition, according to the semiconductor memory device of FIGS. 5–7, the characteristics of the internal clock signal can be verified by excluding the influence of an input circuit, which may add noise to the internal clock signal whose characteristics are to be verified and/or tested.

While the present invention has been particularly shown and described with reference to exemplary embodiments thereof, it should be understood by those of ordinary skill in the art that various changes, substitutions and alterations can be made herein without departing from the scope of the invention as defined by appended claims and their equivalents.

What is claimed is:

1. A semiconductor memory device, comprising:
    an output circuit, which outputs data received from an internal circuit, to an input/output (I/O) interface in synchronism with an output clock signal;
    an input circuit, which outputs data received from the I/O interface, to the internal circuit in synchronism with an input clock signal;
    a first bypass circuit which transmits the output clock signal to the I/O interface; and
    a second bypass circuit which transmits the input clock signal to the I/O interface, wherein, when one of the first and second bypass circuits is operating, the output circuit and the input circuit stop operating.

2. The semiconductor memory device of claim 1, wherein the output circuit comprises:
    a first phase splitter which receives the output clock signal and outputs a complementary output clock signal; and
    a multiplexer (MUX) which outputs the data received from the internal circuit, in synchronism with the complementary output clock signal, and in response to one of a plurality of control signals stops operating.

3. The semiconductor memory device of claim 2, wherein the output circuit, further comprises:
    a data output buffer which outputs the data received from the output circuit to the I/O interface, wherein the data output buffer outputs one of the output clock signal received from the first bypass circuit and the input clock signal received from the second bypass circuit, to the output interface when the output circuit and the input circuit stop operating.

4. The semiconductor memory device of claim 1, further comprising:
    a data output buffer which outputs the data received from the output circuit to the I/O interface, wherein the data output buffer outputs one of the output clock signal received from the first bypass circuit and the input clock signal received from the second bypass circuit, to the output interface when the output circuit and the input circuit stop operating.

5. The semiconductor memory device of claim 1, wherein the input circuit comprises:
    a second phase splitter which receives the input clock signal and outputs a complementary input clock signal; and
    an input buffer which receives input data from the I/O interface, outputs the input data to the internal circuit in synchronism with the complementary input clock signal, and in response to one of a plurality of control signals stops operating.

6. The semiconductor memory device of claim 1, wherein the first bypass circuit comprises:
    a first output clock bypass circuit and a second output clock bypass circuit, wherein the first output clock bypass circuit comprises a first inverter and a first transmission gate; and the second output clock bypass circuit comprises a second inverter and a second transmission gate.

7. The semiconductor memory device of claim 6, wherein the first output clock bypass circuit transmits the output clock signal to the I/O interface in response to one of a plurality of control signals; and the second output clock bypass circuit transmits the complementary output clock signal to the I/O interface in response to one of the plurality of control signals.

8. The semiconductor memory device of claim 1, wherein the second bypass circuit comprises:
    a first input clock bypass circuit and a second input clock bypass circuit, wherein the first input clock bypass circuit comprises a first inverter and a first transmission gate; and the second input clock bypass circuit comprises a second inverter and a second transmission gate.

9. The semiconductor memory device of claim 8, wherein the first input clock bypass circuit transmits the input clock signal to the I/O interface in response to a one of a plurality of control signals; and the second input clock bypass circuit transmits the complementary input clock signal to the I/O interface in response to one of the plurality of control signals.

10. The semiconductor memory device of claim 1, further comprising:
    a clock output buffer for outputting one of the output clock signal received from the first bypass circuit to the I/O interface and the input clock signal received from the second bypass circuit to the I/O interface.

11. The semiconductor memory device of claim 1, further comprising:
    a control circuit which generates a plurality of control signals in response to an address signal and an external control signal.

12. The semiconductor memory device of claim 11, wherein the control circuit comprises:
    a decoder which combines the address signal and the external control signal and generates a set code; and
    a register which generates the plurality of control signals in response to the set code.

13. The semiconductor memory device of claim 1, wherein the first and second bypass circuits are directly connected to the I/O interface.

14. A semiconductor memory device, comprising:
    an input circuit which outputs an input signal received from an input interface, to an internal circuit in synchronism with an internal clock signal; and
    a bypass circuit which transmits the internal clock signal to the input interface, wherein, when the bypass circuit operates, the input circuit stops operating.

15. The semiconductor memory device of claim 14, wherein the input circuit comprises:
    a phase splitter which receives the internal clock signal and outputs a complementary internal clock signal; and
    an input buffer which receives the input signal through the input interface, outputs the input signal to the internal circuit in synchronism with the complementary internal clock signal, and in response to one of a plurality of enable signals stops operating.

16. The semiconductor memory device of claim 14, wherein the bypass circuit comprises:
   a first bypass circuit which transmits the internal clock signal to the input interface in response to one of a plurality of enable signals; and
   a second bypass circuit which transmits the complementary internal clock signal to the input interface in response to one of the plurality of enable signals.

17. The semiconductor memory device of claim 14, further comprising:
   a dummy output buffer, connected between the bypass circuit and the input interface, wherein the dummy output buffer outputs the internal clock signal to the input interface when the input circuit stops operating.

18. The semiconductor memory device of claim 14, further comprising:
   a clock output buffer, connected to the input interface and the bypass circuit, wherein the clock output buffer outputs the internal clock signal to the input interface when the input circuit stops operating.

19. The semiconductor memory device of claim 14, wherein the bypass circuit is directly connected to the input interface.

20. The semiconductor memory device of claim 14, further comprising:
   a clock input buffer which receives an external clock signal and transmits the external clock signal;
   an internal clock generation circuit which receives the external clock signal and generates the internal clock signal; and
   a control circuit which receives an address and a control signal and generates a plurality of enable signals.

21. A semiconductor memory device, comprising:
   an output circuit which outputs data received from an internal circuit to an output interface, in synchronism with an output clock signal; and
   a bypass circuit which transmits the output clock signal to the output interface, wherein, when the bypass circuit is operating, the output circuit stops operating.

22. The semiconductor memory device of claim 21, wherein the output circuit comprises:
   a phase splitter which receives the output clock signal and outputs a complementary output clock signal; and
   a multiplexer (MUX) which outputs the data received from the internal circuit, in synchronism with the complementary output clock signal, and in response to one of a plurality of enable signals stops operating.

23. The semiconductor memory device of claim 21, wherein the bypass circuit comprises:
   a first bypass circuit which transmits the output clock signal to the output interface in response to one of a plurality of enable signals; and
   a second bypass circuit which transmits the complementary output clock signal to the output interface in response to one of the plurality of enable signals.

24. The semiconductor memory device of claim 21, further comprising:
   a clock output buffer, connected to the output interface and the bypass circuit, wherein the clock output buffer outputs the output clock signal to the output interface when the output circuit stops operating.

25. The semiconductor memory device of claim 21, further comprising:
   a data output buffer which outputs the data received from the output circuit to the output interface, wherein the data output buffer outputs the output clock signal received from the bypass circuit to the output interface when the output circuit stops operating.

26. The semiconductor memory device of claim 21, wherein the bypass circuit is directly connected to the output interface.

27. The semiconductor memory device of claim 21, further comprising:
   a clock input buffer which receives an external clock signal and transmits the external clock signal;
   an internal clock generation circuit which receives the external clock signal and generates the output clock signal; and
   a control circuit which receives an address and a control signal and generates a plurality of enable signals.

* * * * *